US011379186B2

(12) United States Patent
Chakraborty et al.

(10) Patent No.: US 11,379,186 B2
(45) Date of Patent: Jul. 5, 2022

(54) MIXED MODE MULTIPLY AND ACCUMULATE UNIT

(71) Applicant: International Business Machines Corporation, Armonk, NY (US)

(72) Inventors: Sudipto Chakraborty, Plano, TX (US); Rajiv Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 416 days.

(21) Appl. No.: 16/735,301

(22) Filed: Jan. 6, 2020

(65) Prior Publication Data

US 2021/0208848 A1 Jul. 8, 2021

(51) Int. Cl.
*H03M 1/66* (2006.01)
*G06F 7/544* (2006.01)
*G06F 1/04* (2006.01)

(52) U.S. Cl.
CPC .............. *G06F 7/5443* (2013.01); *G06F 1/04* (2013.01); *H03M 1/66* (2013.01)

(58) Field of Classification Search
CPC .......... G06F 1/04; G06F 7/544; G06F 7/5443; G06F 2207/4814; H03M 1/66; H03M 1/742
See application file for complete search history.

(56) References Cited

U.S. PATENT DOCUMENTS

| 10,044,366 | B2 | 8/2018 | Kwon et al. |
| 10,333,533 | B1* | 6/2019 | Moscone ............... H03H 11/00 |
| 10,425,099 | B1 | 9/2019 | Aouini et al. |
| 10,680,640 | B2 | 6/2020 | Peterson et al. |
| 10,879,923 | B1* | 12/2020 | Chakraborty ......... H03M 1/662 |
| 2007/0121716 | A1 | 5/2007 | Nagarajan et al. |
| 2010/0109734 | A1* | 5/2010 | Rylov .................... H03H 11/20 327/237 |
| 2010/0241601 | A1 | 9/2010 | Carson et al. |

(Continued)

OTHER PUBLICATIONS

Lee, K., et al., "A Low-power, Mixed-mode Neural Network Classifier for Robust Scene Classification", Journal of Semiconductor Technology and Science, Feb. 2019, 8 pages, vol. 19, No. 1.

(Continued)

*Primary Examiner* — Siu M Lee
(74) *Attorney, Agent, or Firm* — Scully, Scott, Murphy & Presser, P.C.; Daniel P. Morris

(57) ABSTRACT

Systems and methods to implement a multiply and accumulate (MAC) unit is described. In an example, a device can include a first current mode digital-to-analog converter (DAC) configured to multiply an input signal with a first current having a first amplitude to generate a first signal. The device can further include a second current mode DAC configured to multiply the input signal with a second current having a second amplitude to generate a second signal. The second amplitude can be less than the first amplitude. The device can further include a mixer configured to multiply the second signal with a clock signal to generate a third signal. The third signal can be combined with the first signal via a current summing node to generate an output signal. The output signal can be outputted to another device.

20 Claims, 7 Drawing Sheets

(56) References Cited

U.S. PATENT DOCUMENTS

2016/0134460 A1* 5/2016 Lee ................. H04L 27/362
375/261
2021/0326112 A1* 10/2021 Chakraborty ....... G11C 11/1697

OTHER PUBLICATIONS

Madheswaran, M., et al., "Design and Analysis of Low Power Multiply and Accumulate Unit Using Pixel Properties Reusability Technique for Image Processing Systems", ICTACT Journal on Image and Video Processing, Aug. 2012, pp. 459-466, vol. 03, Issue: 01.

List of IBM Patents or Patent Applications Treated as Related dated Jan. 6, 2020, 2 pages.

Notice of Allowance dated Aug. 27, 2020 received in U.S. Appl. No. 16/735,224, 13 pages.

* cited by examiner

MIXED MODE MULTIPLY AND ACCUMULATE UNIT

BACKGROUND

The present disclosure relates in general to hardware with analog-digital mixed mode architecture that can be implemented to perform various operations and algorithms.

In some examples, computer systems can include hardware that can be implemented to perform various operations, such as multiplication, addition, multiply and accumulate (MAC) operations, or other polynomial related operations. The inputs to such hardware can be in digital form, and the hardware can include digital-to-analog converters (DACs) configured to convert the inputs into analog signals for further processing. MACs can be implemented with filters, such as reconstruction filters, to counter aliasing that can be caused by the conversion process.

SUMMARY

In some examples, a device that can implement a multiply and accumulate (MAC) unit is generally described. The device can include a first current mode digital-to-analog converter (DAC) configured to multiply an input signal with a first current having a first amplitude to generate a first signal. The device can further include a second current mode DAC configured to multiply the input signal with a second current having a second amplitude to generate a second signal. The second amplitude can be less than the first amplitude. The device can further include a mixer configured to multiply the second signal with a clock signal to generate a third signal. The third signal can be combined with the first signal via a current summing node to generate an output signal. The output signal can be outputted to another device.

In some examples, a system that can implement a MAC unit is generally described. The system can include a processor configured to generate an input signal and generate a clock signal. The system can further include a first device configured to be in communication with the processor. The first device can include a first current mode digital-to-analog converter (DAC) configured to multiply the input signal with a first current having a first amplitude to generate a first signal. The first device can further include a second current mode DAC configured to multiply the input with a second current having a second amplitude to generate a second signal. The second amplitude can be less than the first amplitude. The first device can further include a mixer configured to multiply the second signal with the clock signal generated by the processor to generate a third signal. The third signal can be combined with to the first signal via a current summing node to generate an output signal. The output signal can be outputted to a second device.

In some examples, a method for implementing a MAC unit is generally described. The method can include receiving, by a device, a digital signal. The method can further include multiplying, by a first current mode DAC of the device, the digital signal with a first current having a first amplitude to generate a first signal. The method can further include multiplying, by a second current mode DAC of the device, the digital signal with a second current having a second amplitude to generate a second signal. The second amplitude can be less than the first amplitude. The method can further include multiplying, by the device, the second signal with a clock signal to generate a third signal. The method can further include adding, by the device, the third signal to the first signal to generate an output signal. The method can further include outputting, by the device, the output signal to another device.

Further features as well as the structure and operation of various embodiments are described in detail below with reference to the accompanying drawings. In the drawings, like reference numbers indicate identical or functionally similar elements.

DETAILED DESCRIPTION

In some examples, hardware systems being used to implement MAC operations can include multiple active stages, such as using voltage mode digital-to-analog converters (DACs) to convert direct current (DC current) to an intermediate frequency (IF frequency) according to an input digital code, using filters (e.g., such as anti-aliasing or reconstruction filters, or baseband filters, etc.) to cure noise and distortions caused by the DAC conversion, and using drivers to perform voltage-to-current conversion for amplification and transmission to other hardware. The conversion performed by voltage mode DACs can be non-linear due to high signal swing, and the voltage-to-current conversion by the driver can also reduce linearity. The non-linear nature of these conversions can cause a reduction in dynamic range by the hardware. The active filters can also utilize a significant amount of power. In some examples, oversampling techniques can reduce filtering, but additional power is required for these oversampling techniques. In other examples, additional layers of filters can be used to perform lower oversampling, but the additional layers can increase device sizes and also increase the number of active stages.

The hardware systems described in accordance with the present disclosure can reduce the number of active stages by utilizing an analog-digital mixed mode architecture. The hardware systems can use current mode devices as filters to counter signal distortions, leading to elimination of filters and drivers' usage. The elimination of active filters and drivers can enhance linearity of the hardware system. The elimination of filters and drivers, along with the enhanced linearity, can reduce device size and power consumption by the hardware systems. Further, hardware systems described in accordance with the present disclosure can provide a direct interface with, for example, magnetoresistive random-access memory (MRAM), resistive random-access memory (ReRAM), phase changing memory (PCM), and/or other types of non-volatile memory, by sharing current with the memory element itself, and in an embodiment, no additional bias current is needed.

In an example, a supply of electrical energy can be regulated under either voltage mode or current mode. Voltage mode can provide a constant output voltage, and current mode can provide a constant current into a variety of load voltage conditions. A voltage source can be used to regulate a supply in voltage mode, and a current source can be used to regulate a supply in current mode. The voltage swing across switching components of a current mode DAC can be minimal, leading to improved linearity. Further, stray capacitance of a current mode DAC may not affect the speed of response of the circuit due to constant ladder node voltages.

Figure 1:
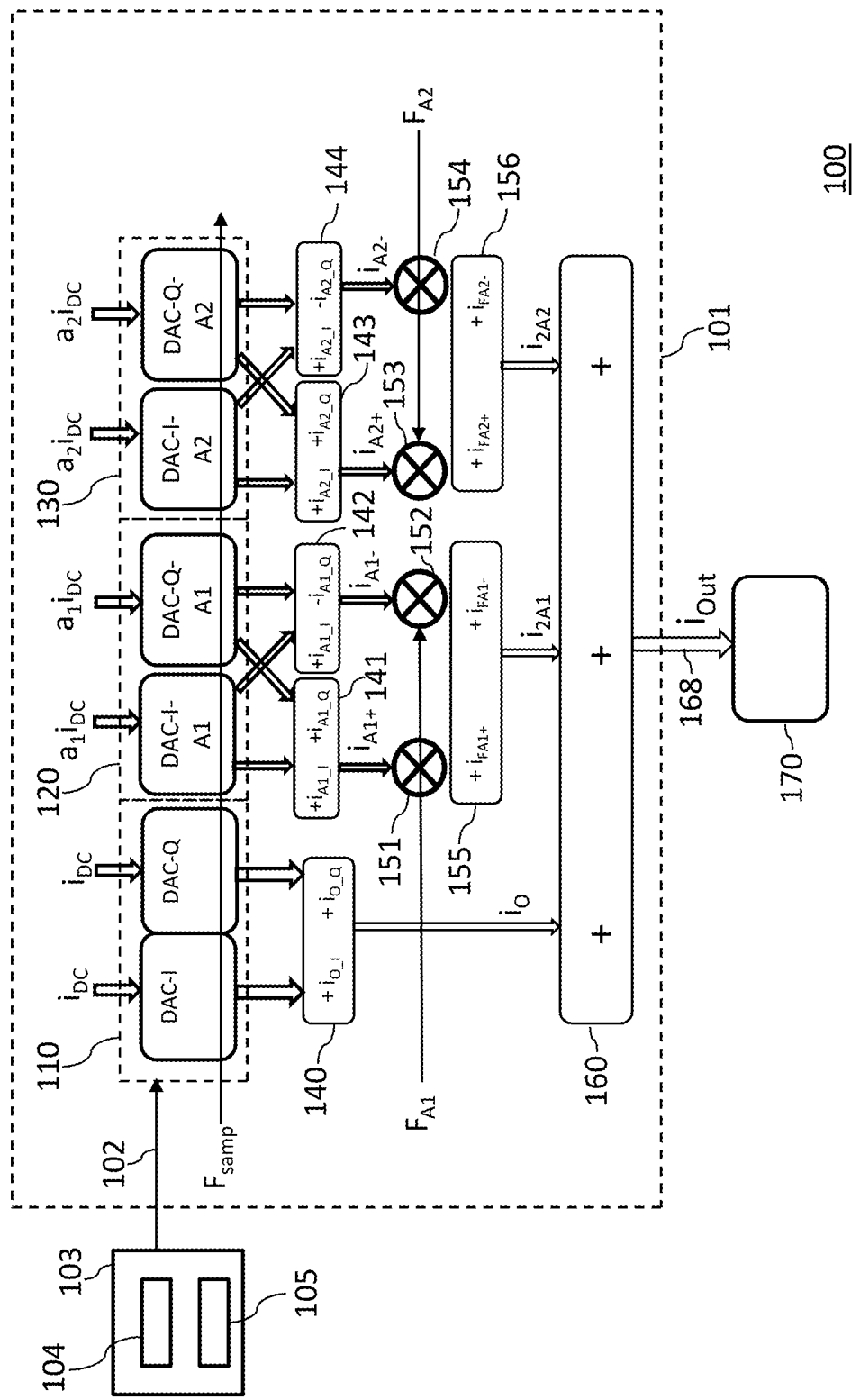
FIG. 1 is a diagram showing an example architecture of a mixed mode multiply and accumulate unit in one embodiment.

FIG. 1 is a diagram showing an example architecture of a mixed mode multiply and accumulate unit in one embodiment. In the example shown in FIG. 1, a system 100 can include a device 101, a processor 101, and a device 170. The device 101 can be a mixed mode multiply and accumulate unit that can be configured to perform operations in mixed mode, such as multiplying digital signals with analog signals. The device 170 can include one or more components that can receive an output signal or current 168 from the device 101. For example, the device 170 can be a memory device, such as MRAM, resistive random-access memory (ReRAM), phase changing memory (PCM), and/or other types of non-volatile memory or memory device. In another example, the device 170 can be a sensor, a device under test (DUT), and/or other types of device. The processor 103 can include a memory 104 and/or a clock generator 105. In examples where the device 170 is a memory device (e.g., MRAM), the device 170 can be a part of the memory 104. The clock generator 105 can be a signal generator configured to generate different clock signals of different frequencies.

The device 101 can include N current mode DACs, corresponding to N order Nyquist image. In the example shown in FIG. 1, N=3 and the device 101 can include three DACs—a DAC 110, a DAC 120, and a DAC 130. In some examples, one of these DACs can be a main signal DAC, and the rest of the DACs (the N−1 DACs) can be auxiliary DACs representing Nyquist image amplitudes. In an example embodiment, the DACs 120 and 130 (and any DACs in addition to DAC 110) can be low power DACs such that DACs 120 and 130 may consume relatively less power when compared to power consumption by the DAC 110. The DACs 110, 120, and 130 can receive an input 102, a clock signal of a sampling clock with frequency $F_{samp}$, and respective constant current, such as direct current (DC) signals. The clock signal of sampling frequency $F_{samp}$ can be generated by the clock generator 105. The input 102 can be a digital input can include be a digital signal of a bit length L. The sampling frequency $F_{samp}$ can be defined based on a desired implementation of the system 100. The DACs 110, 120, 130 can be multiply and accumulate (MAC) processors or units.

In the example shown in FIG. 1, the DAC 110 can receive the DC current $i_{DC}$, the DAC 120 can receive a scaled DC current $a_1 i_{DC}$, and the DAC 130 can receive a scaled DC current $a_2 i_{DC}$. For N DACs, where k=1, . . . N, there can be N−1 coefficients ranging from $a_1, \ldots a_{N-1}$. The values of the coefficients $a_k$ can represent signal energy around Nyquist zones, and can be relatively small when compared to 1. The values of the coefficients $a_k$ can be adjusted to counter distortions caused by Nyquist images and aliasing that may result from the conversion perform by the DAC 110.

The DACs 110, 120, and 130 can include respective current mode DAC circuits to process at least one of the in-phase (I) component or the quadrature (Q) components of a signal. For example, the DAC-I block of the DAC 110 is configured to multiply the input 102 with the in-phase component of the DC current $i_{DC}$, and the DAC-Q block of the DAC 110 is configured to multiply the input 102 with the quadrature component of the DC current $i_{DC}$. Similarly, the DAC 120 includes a block DAC-I-A1 and a block DAC-Q-A1, and the DAC 130 includes a block DAC-I-A2 and a block DAC-Q-A2. In examples where the DACs 110, 120, 130 are configured to process both the I and Q components of a signal, the system 100 can be implementing single sideband operations. In examples where the DACs 110, 120, 130 are configured to process one of the I and the Q components of a signal, the system 100 can be implementing double sideband operations.

The DAC-I block of the DAC 110 can multiply the input 102 with the in-phase (I) component of the DC current $i_{DC}$, and the resulting product can get sampled at the sampling frequency $F_{samp}$ to generate a current $i_{O\_I}$. The DAC-Q block of the DAC 110 can multiply the input 102 with the quadrature (Q) component of the DC current $i_{DC}$, and the resulting product can get sampled at the sampling frequency $F_{samp}$ to generate a current $i_{O\_Q}$. The currents $i_{O\_I}$ and $i_{O\_Q}$ can be inputted into a node 140, where the node 140 can be a current summing node that can add or combine the I and Q current terms $i_{O\_I}$ and $i_{O\_Q}$ to generate another set of quadrature currents given by current $i_{O+}$ and $i_{O-}$ (collectively labeled as $i_O$) and where $i_{O+}=\alpha i_{O\_I}+\beta i_{O\_Q}$, and $i_{O-}=\beta i_{O\_Q}-\alpha i_{O\_I}$. The weight factors $\alpha$ and $\beta$ can be derived from trigonometry, and under this transformation, $i_{O+}$ and $i_{O-}$ are substantially in quadrature, and can be used to compensate for any I/Q imbalance in the clock phasor system (e.g., the clock generator 105). Note that when $\alpha=\beta=1$, the I and Q vectors can be used in equal amounts, leading to cancellation of $2^{nd}$, $6^{th}$, $12^{th}$ harmonics. This is simply due to the fact that the second harmonic of 90° vector provides 180° phase, leading to complete cancellation of the $2^{nd}$ order Nyquist image. The same scenario appears for the $6^{th}$ and $12^{th}$ harmonics of the clock Fsamp. Hence, a simple current mode addition and subtraction can be used to cancel even order clock harmonics, leading to high dynamic range operation. Note that a quadrature component being added to, or subtracted from, a current can result in current harmonics, such as a new current with new frequency that is an integer multiple of the frequency of the old current. Further, the implementation of the system 100 using current mode devices can reduce usage of some components such as amplifiers, improving device sizing and power consumption. For example, the node 140 can be a current summing node implemented by connecting two wires of the same phase together to combine current. Nodes being used for determining current differences can be current difference nodes, and can be implemented by connecting two wires that are flipped or reversed such that both terminals indicate differential signal.

The DAC-I-A1 block of the DAC 120 can multiply the input 102 with the in-phase component of the DC current $a_1 i_{DC}$, and the resulting product can get sampled by the sampling frequency $F_{samp}$ to generate a current $i_{A1\_I}$. The DAC-Q-A1 block of the DAC 120 can multiply the input 102 with the quadrature component of the DC current $a_1 i_{DC}$, and the resulting product can get sampled by the clock signal of sampling frequency $F_{samp}$ to generate a current $i_{A1\_Q}$. The currents $i_{A1\_I}$ and $i_{A1\_Q}$ can be inputted into a node 141, where the node 141 can be a current summing node that can add or combine $i_{A1\_I}$ and $i_{A1\_Q}$ to generate a current $i_{A1+} = \alpha i_{A1\_I} + \beta i_{A1\_Q}$. The currents $\alpha i_{A1\_I}$ and $\beta i_{A1\_Q}$ can be inputted into a node 142, where the node 142 can be a current difference node that can subtract $i_{A1\_I}$ from $i_{A1\_Q}$ to generate a current $i_{A1-} = \beta i_{A1\_Q} - \alpha i_{A1\_I}$. The current $i_{A1+}$ can be inputted into a mixer 151, where the mixer 151 can be a circuit configured to multiply the I component of the outputs from the node 141 ($i_{A1+}$ and $i_{A1-}$) with the I component of a clock signal of frequency $F_{A1}$ to generate a current $i_{FA1+}$. The current $i_{A1-}$ can be inputted into a mixer 152, where the mixer 152 can be a circuit configured to multiply the Q components of the outputs from the node 141 ($i_{A1+}$ and $i_{A1-}$) with the Q component of the clock signal of frequency $F_{A1}$ to generate a current $i_{FA1-}$. The currents $i_{FA1+}$ and $i_{FA1-}$ can be inputted into a node 155, where the node 155 can be a current summing node that can add or combine the currents $i_{FA1+}$ and $i_{FA1-}$ to generate a set of currents labeled as $i_{2A1}$.

The DAC-I-A2 block of the DAC 130 can multiply the input 102 with the in-phase component of the DC current $a_2 i_{DC}$, and the resulting product can get sampled by the sampling frequency $F_{samp}$ to generate a current $i_{A2\_I}$. The DAC-Q-A2 block of the DAC 130 can multiply the input 102 with the quadrature component of the DC current $a_2 i_{DC}$, and the resulting can get sampled by the sampling frequency $F_{samp}$ to generate a current $i_{A2\_Q}$. The currents $i_{A2\_Q}$ and $i_{A2\_Q}$ can be inputted into a node 143, where the node 143 can be a current summing node that can add or combine $i_{A2\_Q}$ and $i_{A2\_Q}$ to generate a current $i_{A2+} = \alpha i_{A2\_I} + \beta i_{A2\_Q}$. The currents $\alpha i_{A2\_I}$ and $\beta i_{A2\_Q}$ can be inputted into a node 144, where the node 144 can be a current difference node that can subtract $i_{A2\_I}$ from $i_{A2\_Q}$ to generate a current $i_{A2-} = \beta i_{A2\_Q} - \alpha i_{A2\_I}$. The current $i_{A2+}$ can be inputted into a mixer 153, where the mixer 153 can be a circuit configured to multiply the I component of the outputs from the node 143 ($i_{A2+}$ and $i_{A2-}$) with the I component of a clock signal of frequency $F_{A2}$ to generate a current $i_{FA2+}$. The frequency $F_{A2}$ can be the same or different from the frequency $F_{A1}$. Further, the clock signals of frequencies $F_{A1}$ and $F_{A2}$ can be clock signals generated from the same clock system (e.g., clock generator 105) that generated the sampling frequency $F_{samp}$. The current $i_{A2-}$ can be inputted into a mixer 154, where the mixer 154 can be a circuit configured to multiply the Q component of the outputs from the node 143 ($i_{A2+}$ and $i_{A2-}$) with the Q component of the clock signal of frequency $F_{A2}$ to generate a current $i_{FA2-}$. The currents $i_{FA2+}$ and $i_{FA2-}$ can be inputted into a node 156, where the node 156 can be a current summing node configured to add or combine the currents $i_{FA2+}$ and $i_{FA2-}$ to generate a set of currents labeled as $i_{2A2}$.

The currents $i_O$, $i_{2A1}$, and $i_{2A2}$, can be inputted into a node 160, where the node 160 can be a current summing node that can add or combine the currents $i_O$, $i_{2A1}$, and $i_{2A2}$ to generate the output current 168 (denoted as $i_{Out}$). In an example embodiment, the amplitude of the currents $i_{2A1}$, and $i_{2A2}$ can be relatively small when compared to the amplitude of the current $i_O$. The addition of the relatively small currents $i_{2A1}$, and $i_{2A2}$ to the current $i_O$ can provide adjustments of the current $i_O$ to counter distortion and aliasing that may result from the conversion performed by the DAC 110, without significantly modifying the current $i_O$ itself. Further, the frequencies $F_{A1}$ and $F_{A2}$ can be adjusted individually to shift the currents outputted from the current summing and difference nodes. This individual shifting allows the system 100 to adjust amplitudes of the current $i_O$ at desired frequency positions to counter distortions and aliasing. The signals or currents other than the main signal ($i_O$) can be upconverted signals with respect to the difference frequency elements of Nyquist images that may be present in the main signal. Additional low power DACs can be added to provide further refinement and adjustment of the current $i_O$.

The output current 168 can be sent to the device 170. In an example where the device 170 can be a MRAM cell, the output current 168 can be used to perform reading and writing operations on the MRAM cell. In another example, the device 170 can be a MRAM cell among a plurality or an array (e.g., a crossbar array) of MRAM cells configured to implement an artificial neural network. The bit length L of the input 102 can represent a number of write lines to select particular MRAM cells for writing or reading operations. The analog input to the DACs 110, 120, 130, can be current representing weights to be written in a write operation. By utilizing the example architecture shown in FIG. 1 to implement artificial neural networks, computations such as multiplications, additions, and multiply and accumulate operations can be performed with improved performance such as lower power consumption (due to not using a filter for voltage mode devices) and improved linearity of the signals being processed by the system 100.

Figure 2:
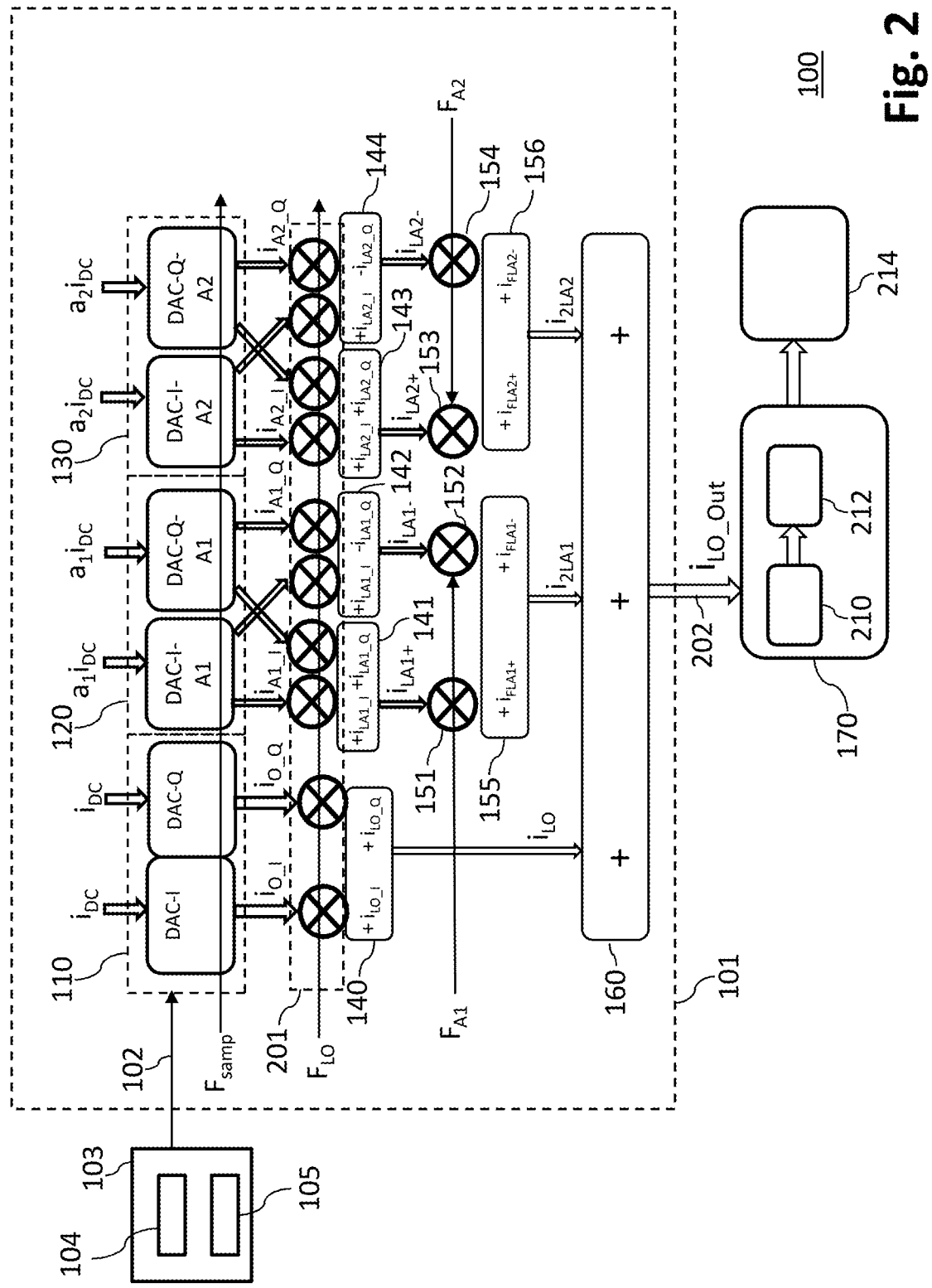
FIG. 2 is a diagram showing another example architecture of a mixed mode multiply and accumulate unit in one embodiment.

FIG. 2 is a diagram showing another example architecture of a mixed mode multiply and accumulate unit in one embodiment. FIG. 2 may include components that are labeled identically to components of FIG. 1, which are not described again for the purposes of clarity. The description of FIG. 2 may reference at least some of the components of FIG. 1.

The system 100 can further include a plurality of mixers 201 that may be situated between the DACs (110, 120, 130) and the nodes (140, 141, 142, 143, 144). The mixers 201 can be configured to multiply a local oscillator clock signal of frequency $F_{LO}$ with an input current to shift the input current as an intermediate step in transmission or reception operations. The multiplication of the input current with the local oscillator clock signal of frequency $F_{LO}$ can be referred to as heterodyning. In the example shown in FIG. 2, the currents $i_{O\_I}$ and $i_{O\_Q}$ outputted from the DAC 110 can be inputted into respective mixers 201. The mixers 201 can multiply the currents $i_{O\_I}$ and $i_{O\_Q}$ with $F_{LO}$ to shift the currents $i_{O\_I}$ and $i_{O\_Q}$ to a desirable frequency for transmission or reception purposes. The frequency shifted currents based on the currents $i_{O\_I}$ and $i_{O\_Q}$ can be heterodyne signals denoted as $i_{LO\_I}$ and $i_{LO\_Q}$, respectively. The currents $i_{LO\_I}$ and $i_{LO\_Q}$ can be combined by the node 140 to generate a current $i_{LO}$.

The currents $i_{A1\_I}$ and $i_{A1\_Q}$ outputted from the DAC 120 can be inputted into respective mixers 201. The mixers 201 can multiply the currents $i_{A1\_I}$ and $i_{A1\_Q}$ with $F_{LO}$ to adjust the frequencies of the currents $i_{A1\_I}$ and $i_{A1\_Q}$ to facilitate transmission or reception operations. For example, the adjusted frequencies can be the same as a $F_{LO}$, where $F_{LO}$ can be the operating frequency of the device 101. The adjusted currents based on the currents $i_{A1\_I}$ and $i_{A1\_Q}$ can be denoted as $i_{LA1\_1}$, and $i_{LA1\_Q}$, respectively, in the example shown in FIG. 2. The currents $i_{LA1\_1}$, and $i_{LA1\_Q}$ can be combined by the node 141 to generate a current $i_{LA1+}$. The currents $i_{LA1\_1}$, and $i_{LA1\_Q}$ can be sent to the node 142 to generate a current $i_{LA1-}$. The currents $i_{FLA1+}$ and $i_{FLA1-}$ can be combined by the node 155 to generate a current $i_{2LA1} = i_{FLA1+} + i_{FLA1-}$.

The currents $i_{A2\_I}$ and $i_{A2\_Q}$ outputted from the DAC 120 can be inputted into respective mixers 201. The mixers 201 can multiply the I and Q components of the currents $i_{A2\_I}$, and $i_{A2\_Q}$ with the I and Q component of $F_{LO}$ to shift the currents $i_{A2\_I}$ and $i_{A2\_Q}$ to desirable phase for transmission or reception purposes. The shifted currents based on the currents $i_{A2\_I}$ and $i_{A2\_Q}$ can be denoted as $i_{LA2\_I}$ and $i_{LA2\_Q}$, respectively, in the example shown in FIG. 2. The currents $i_{LA2\_I}$ and $i_{LA2\_Q}$ can be combined by the node 141 to generate a current $i_{LA2+}$. The currents $i_{LA2\_I}$ and $i_{LA2\_Q}$ can be sent to the node 142 to generate a current $i_{LA2-}$. The currents $i_{FLA2+}$ and $i_{FLA2-}$ can be combined by the node 156 to generate a current $i_{2LA1} = i_{FLA2+} + i_{FLA2-}$.

The currents $i_{LO}$, $i_{2LA1}$, and $i_{2LA2}$, can be combined by the circuit 160 to generate the output current 202 (denoted as $i_{LO\_Out}$). The output current 202 can be sent to the device 170. In the example shown in FIG. 2, the device 170 can include a transformer 210 and a matching network 212. The transformer 210 can receive the output current 202 and transmit electrical energy produced from the flow of the output current 202 towards the matching network 212. The matching network 212 can be configured to match the input impedance of another device, such as a device 214, with the output impedance of the device 101, where the matching can maximize power transfer or minimize signal reflection from the device 214. In an example, the device 214 can be a sensor that receives data or power from the system 100 (e.g., receive the output current 202). By applying the local oscillator frequency $F_{LO}$ and using the mixers 201, the device 101 can process incoming analog signals (e.g., currents) for transmission or reception purposes.

Figure 3:
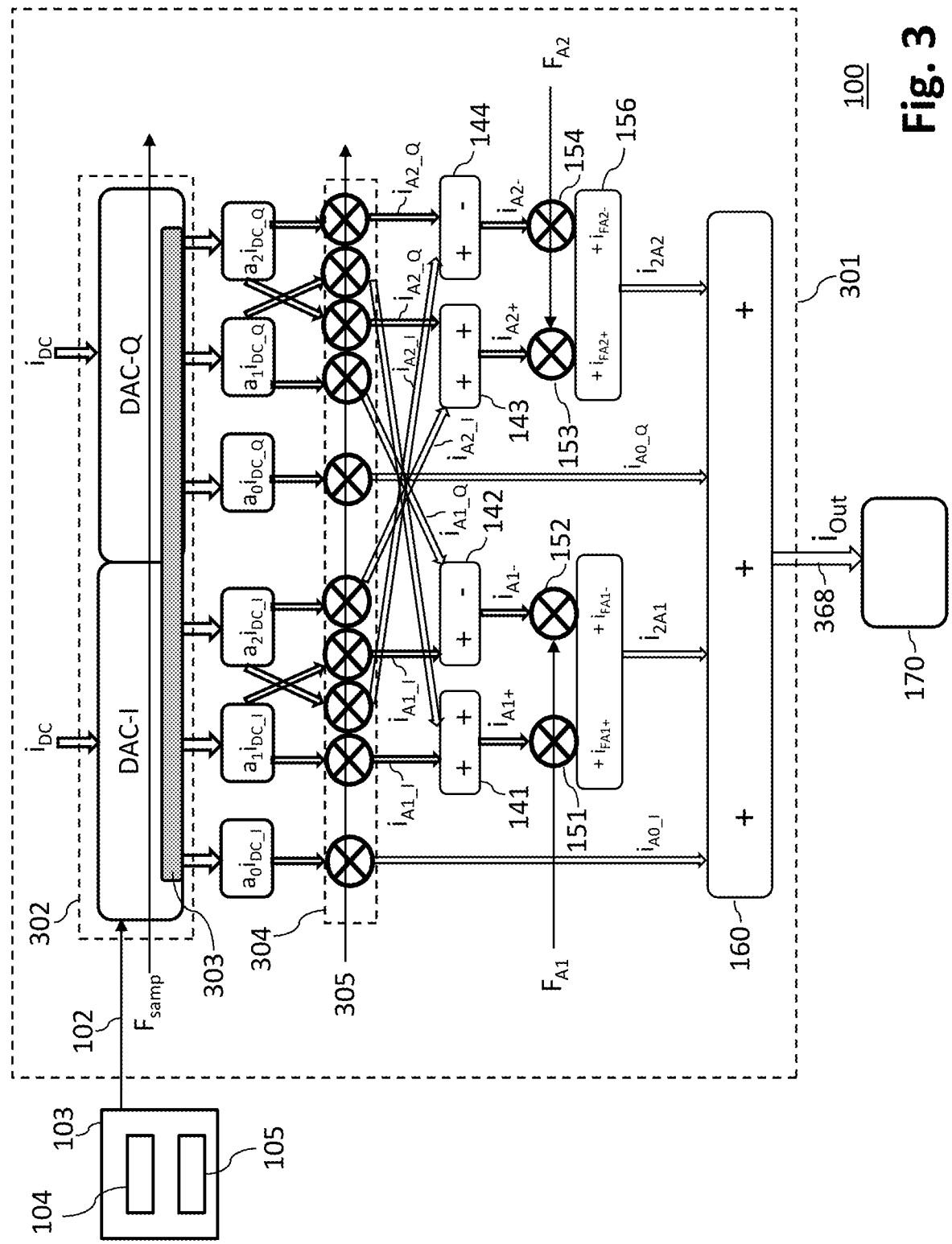
FIG. 3 is a diagram showing another example architecture of a mixed mode multiply and accumulate unit in one embodiment.

FIG. 3 is a diagram showing another example architecture of a mixed mode multiply and accumulate unit in one embodiment. FIG. 3 may include components that are labeled identically to components of FIGS. 1-2, which will not be described again for the purposes of clarity. The description of FIG. 3 may reference at least some of the components of FIGS. 1-2.

In an example shown in FIG. 3, the system 100 can include a device 301, the processor 101, and the device 170. The device 301 can be a mixed mode multiply and accumulate unit that can be configured to perform operations in mixed mode, such as multiplying digital signals with analog signals. The device 170 can include one or more components that can receive an output signal or current 368 from the device 301.

The device 301 can include a current mode DAC 302. The DAC 302 can be coupled to a current splitter or divider 303. The DAC 302 can receive the input 102, the clock signal with sampling frequency $F_{samp}$, and constant current $i_{DC}$, such as direct current (DC) signals. The DAC 302 can include a DAC-I block or circuit and a DAC-Q block or circuit configured to process different components of the current $i_{DC}$, such as at least one of the I and Q components of a signal. The DAC-I block of the DAC 302 can multiply the input 102 with the in-phase component of $i_{DC}$, and the resulting product can get sampled by the sampling frequency $F_{samp}$ to generate a first signal $i_{DC\_I}$. The DAC-Q block of the DAC 302 can multiply the input 102 with the quadrature component of $i_{DC}$, and the resulting product can get sampled by the sampling frequency $F_{samp}$ to generate a second signal $i_{DC\_Q}$. The DAC 302 can be a multiply and accumulate (MAC) processor or unit. In examples where the DAC 302 is configured to process both the I and Q components of a signal, the system 100 can be implementing single sideband operations. In examples where the DAC 302 is configured to process one of the I and the Q components of a signal, the system 100 can be implementing double sideband operations.

The current divider 303 can divide the currents $i_{DC\_I}$ into N signals, and can divide the currents $i_{DC\_Q}$ into N signals. In the example shown in FIG. 3, N=3, and the current divider 303 can divide the current $i_{DC\_I}$ into three signals $a_0 i_{DC\_I}$, $a_1 i_{DC\_I}$, and $a_2 i_{DC\_I}$. The current divider 303 can also divide the current $i_{DC\_Q}$ into three signals $a_0 i_{DC\_Q}$, $a_1 i_{DC\_Q}$, and $a_0 i_{DC\_Q}$. The currents outputted by the current divider can be 2N currents. For k=1, ... N, a sum of the coefficients $a_k$ can be 1. For instances, in the example where N=3, a sum of the coefficients $a_0$, $a_1$ and $a_2$ can be 1. The values of the coefficients $a_k$ can be adjusted according to a desired implementation of the system 100. For example, the values of the coefficients $a_k$ can be adjusted to counter distortions caused by Nyquist images and aliasing that may result from the conversion perform by the DAC 302.

The device 302 can further include a plurality of mixers 304. The mixer can receive inputs such as DC voltage or a bypass signal to multiply the currents outputted by the current divider 303. The mixers 304 can output the I component $i_{40\_I}$ and the Q component $i_{40\_Q}$ of the signal $a_0 i_{DC}$ to the circuit 160. The mixers 304 can output the I component $i_{A1\_I}$ and the Q component $i_{A1\_Q}$ of the signal $a_0 i_{DC}$ to the circuits 141, 142. The mixers 304 can output the I component $i_{A2\_Q}$ and the Q component $i_{A2\_Q}$ of the signal $a_0 i_{DC}$ to the circuits 143, 144.

The node 141 can add or combine $i_{A1\_I}$ and $i_{A1\_Q}$ to generate the signal or current $i_{A1+} = i_{A1\_I} + i_{A1\_Q}$. The node 142 can subtract $i_{A1\_Q}$ from $i_{A1\_I}$ to generate the current $i_{A1-} = i_{A1\_I} - i_{A1\_Q}$. The mixer 151 can multiply the current $i_{A1+}$ with a clock signal of frequency $F_{A1}$ to generate a current $i_{FA1+}$. The mixer 152 can multiply the current $i_{A1-}$ with the clock signal of frequency $F_{A1}$ to generate a current $i_{FA1-}$. The node 155 can add or combine the currents $i_{FA1+}$ and $i_{FA1-}$ to generate a current $i_{2A1}$.

The node 143 can add or combine $i_{A2\_Q}$ and $i_{A2\_Q}$ to generate the signal or current $i_{A2+} = i_{A2\_I} + i_{A2\_Q}$. The node 144 can subtract $i_{A2\_Q}$ from $i_{A2\_I}$ to generate the current $i_{A2-} = i_{A2\_I} - i_{A2\_Q}$. The mixer 153 can multiply the current $i_{A2+}$ with a clock signal of frequency $F_{A2}$ to generate a current $i_{FA2+}$. The mixer 154 can multiply the current $i_{A2-}$ with the clock signal of frequency $F_{A2}$ to generate a current $i_{FA2-}$. The node 155 can add or combine the currents $i_{FA2+}$ and $i_{FA2-}$ to generate a current $i_{2A2}$.

The currents $i_{40\_I}$, $i_{40\_Q}$, $i_{2A1}$, and $i_{2A2}$, can be inputted into a node 160, where the node 160 can be a current summing node that can add or combine the currents $i_O$, $i_{2A1}$, and $i_{2A2}$ to generate the output current 368 (denoted as $i_{Out}$). In an example embodiment, a value of $a_0$ can be defined to be significantly larger than the coefficients $a_1, \ldots a_N$. For example, $a_0$ can be 1, $a_1$ can be 0.2, and $a_2$ can be 0.1. A significant difference between $a_0$ and $a_1, \ldots a_N$ can cause the amplitudes of the currents $i_{2A1}$, and $i_{2A2}$ to be significantly less than the amplitude of the currents $i_{40\_I}$ and $i_{40\_Q}$. The addition of the relatively small currents $i_{2A1}$, and $i_{2A2}$ to the currents $i_{40\_I}$ and $i_{40\_Q}$ can provide adjustments of the currents $i_{40\_I}$ and $i_{40\_Q}$ to counter distortion and aliasing that may result from the conversion performed by the DAC 302, without significantly modifying the currents $i_{40\_I}$ and $i_{40\_Q}$. Further, the frequencies $F_{A1}$ and $F_{A2}$ can be adjusted individually to shift the currents outputted from the summing and differential amplifiers. This individual shifting allows the system 100 to adjust amplitudes of the currents $i_{40\_I}$ and $i_{40\_Q}$ at desired frequency positions to counter distortions and aliasing. The current divider 303 can be configured to divide $i_{DC}$ into different number of currents to provide further refinement and adjustment of the currents $i_{40\_I}$ and $i_{40\_Q}$.

Figure 4:
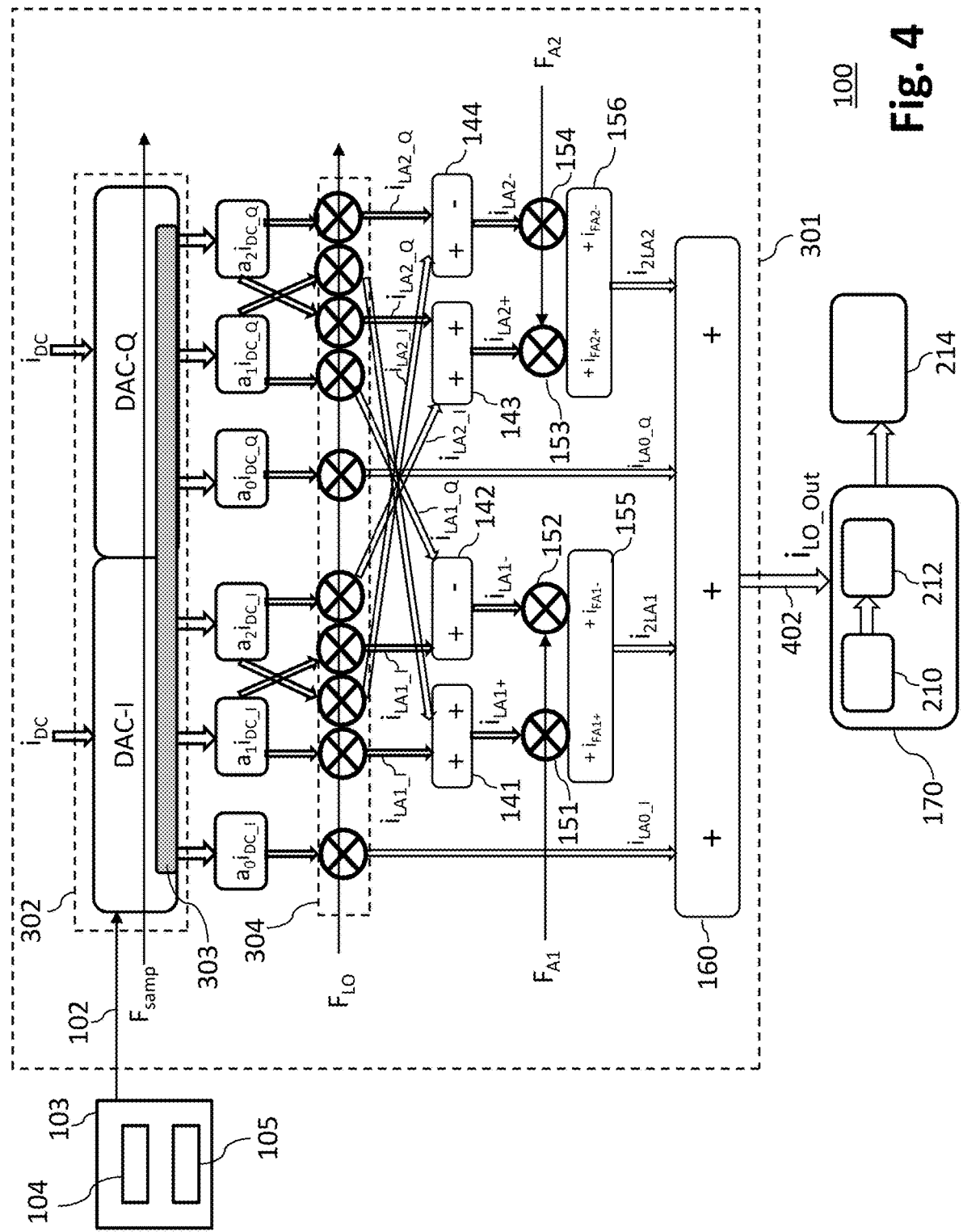
FIG. 4 is a diagram showing another example architecture of a mixed mode multiply and accumulate unit in one embodiment.

FIG. 4 is a diagram showing another example architecture of a mixed mode multiply and accumulate unit in one embodiment. FIG. 4 may include components that are labeled identically to components of FIGS. 1-3, which will not be described again for the purposes of clarity. The description of FIG. 4 may reference at least some of the components of FIGS. 1-3.

In an example embodiment shown in FIG. 4, the plurality of mixers 304 can be configured to multiply a local oscillator clock signal of frequency $F_{LO}$ with the currents outputted from the current divider 303. The application of the local oscillator clock signal of frequency $F_{LO}$ can adjust the frequencies of the currents from the current divider 303 to facilitate transmission or reception operations. For example, the adjusted frequencies can be the same as a $F_{LO}$, where $F_{LO}$ can be the operating frequency of the device 101. The multiplication of the input current with the local oscillator clock signal of frequency $F_{LO}$ can be referred to as heterodyning.

In the example shown in FIG. 2, the currents $a_0 i_{DC\_I}$, $a_1 i_{DC\_I}$, $a_2 i_{DC\_I}$, and $a_0 i_{DC\_Q}$, $a_1 i_{DC\_Q}$, and $a_2 i_{DC\_Q}$ outputted from the current divider 303 can be inputted into respective mixers 304. The mixers 304 can multiply the I and Q components of the currents outputted from the current divider 303 with $F_{LO}$ to generate heterodyne signals $i_{LA0\_I}$, $i_{LA0\_Q}$, $i_{LA1\_I}$, $i_{LA1\_Q}$, $i_{LA2\_I}$, $i_{LA2\_Q}$. The currents $i_{LA1\_I}$ and $i_{LA1\_Q}$ can be combined by the node 141 to generate a current $i_{LA1+}$. The currents $i_{LA1\_I}$ and $i_{LA1\_Q}$ can be sent to the node 142 to generate a current $i_{LA1-}$. The currents $i_{FLA1+}$ and $i_{FLA1-}$ can be combined by the node 155 to generate a current $i_{2LA1} = i_{FLA1+} + i_{FLA1-}$. The currents $i_{LA2\_I}$ and $i_{LA2\_Q}$ can be combined by the node 141 to generate a current $i_{LA2+}$. The currents $i_{LA2\_I}$ and $i_{LA2\_Q}$ can be sent to the node 142 to generate a current $i_{LA2-}$. The currents $i_{FLA2+}$ and $i_{FLA2-}$ can be combined by the node 156 to generate a current $i_{2LA1}$.

The currents $i_{LA0\_I}$, $i_{LA0\_Q}$, $i_{2LA1}$, and $i_{2LA2}$, can be combined by the node 160 to generate the output current 402 (denoted as $i_{LO\_Out}$). The output current 402 can be sent to the device 170. In the example shown in FIG. 4, the device 170 can include a transformer 210 and a matching network 212. The transformer 210 can receive the output current 402 and transmit electrical energy produced from the flow of the output current 402 towards the matching network 212. The matching network 212 can be configured to match the input impedance of another device, such as a device 214, with the output impedance of the device 101, where the matching can maximize power transfer or minimize signal reflection from the device 214. In an example, the device 214 can be a sensor that receives data or power from the system 100 (e.g., receive the output current 402). By applying the local oscillator frequency $F_{LO}$ and using the mixers 201, the device 101 can process incoming analog signals (e.g., currents) for transmission or reception purposes.

Figure 5:
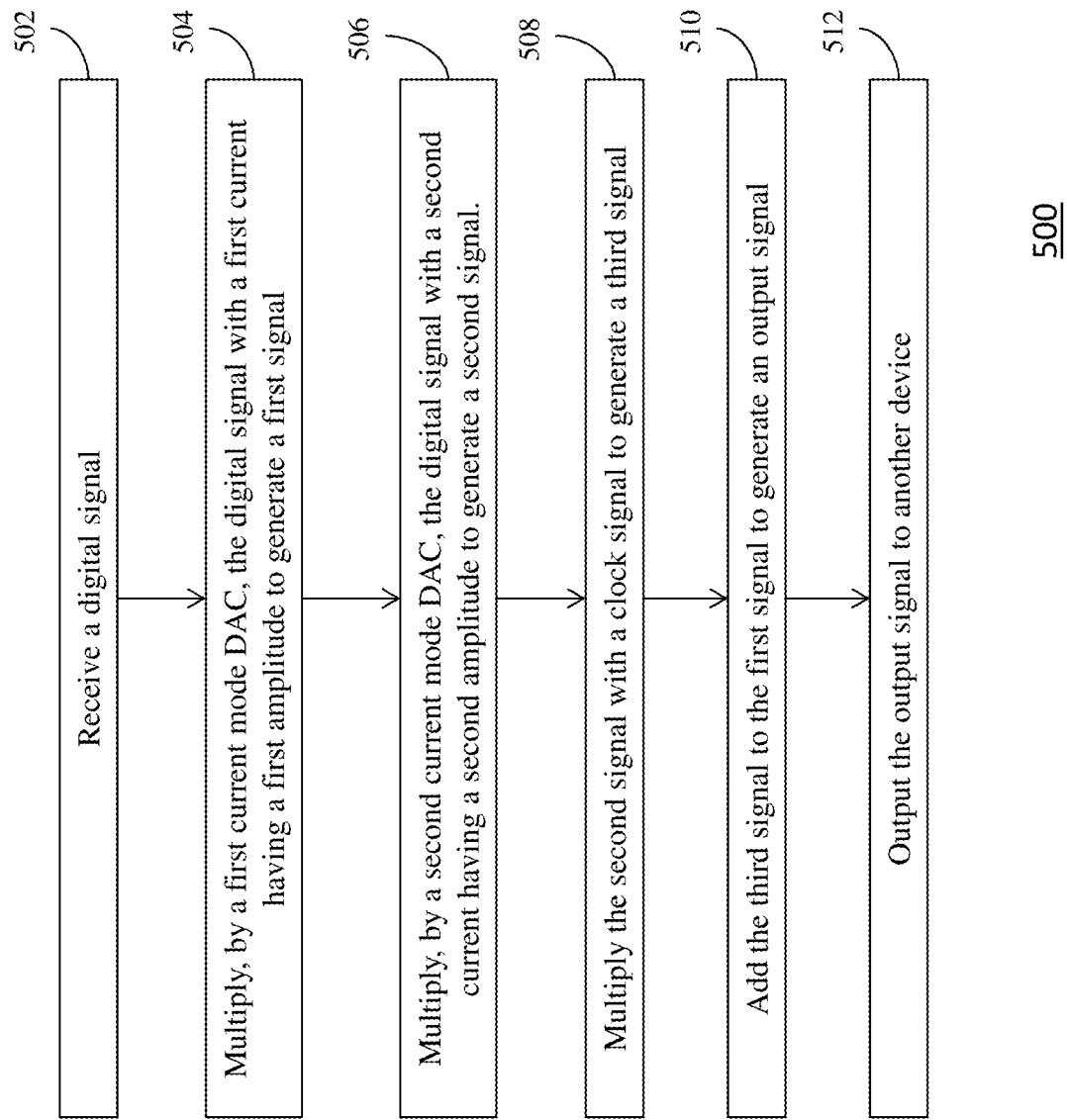
FIG. 5 a flow diagram illustrating a process that can be performed by a system including a mixed mode multiply and accumulate unit in one embodiment.

FIG. 5 a flow diagram illustrating a process that can be performed by a system including a mixed mode multiply and accumulate unit in one embodiment. An example process 500 may include one or more operations, actions, or functions as illustrated by one or more of blocks 502, 504, 506, 508, 510, and/or 512. Although illustrated as discrete blocks, various blocks can be divided into additional blocks, combined into fewer blocks, eliminated, or performed in parallel, depending on the desired implementation.

The process 500 can begin at block 502. At block 502, a device can receive a digital signal. The process 500 can continue from block 502 to block 504. At block 504, a first current mode DAC of the device can multiply the digital signal with a first current having a first amplitude to generate a first signal. The process 500 can continue from block 504 to block 506. At block 506, a second current mode DAC of the device can multiply the digital signal with a second current having a second amplitude to generate a first signal. The second amplitude can be less than the first amplitude. The process 500 can continue from block 506 to block 508. At block 508, the device can multiply the second signal with a clock signal to generate a third signal. The process 500 can continue from block 508 to block 510. At block 510, the device can add the third signal to the first signal to generate an output signal. The process 500 can continue from block 510 to block 512. At block 512, the device can output the output signal to another device. In some examples, the device receiving the output signal can be a magnetoresistive random-access memory (MRAM).

In some examples, the first signal can include a first in-phase (I) component and a first quadrature (Q) component. The second signal can include a second I component and a second Q component. The device can combine the first I component with the first Q component of the first signal. The device can combine the second I component with the second Q component of the second signal. The device can determine a difference between the second I component and the second Q component of the second signal. The device can multiply the second signal with the clock signal by multiplying the clock signal with the combination of the second I component and the second Q component of the second signal to generate a first portion of the third signal; and multiplying the clock signal with the difference between the second I component and the second Q component of the second signal to generate a second portion of the third signal. The device can combine the first portion of the third signal and the second portion of the third signal to generate the third signal.

In some examples, the device can multiply a local oscillator clock signal with the first signal to generate a first heterodyne signal. The device can multiply the local oscillator clock signal with the second signal to generate a second heterodyne signal. The device can multiply the second signal with the clock signal by multiplying the second heterodyne signal with the clock signal to generate the third signal. The device can use a transformer and a matching network to transmit the output signal to the device receiving the output signal.

Figure 6:
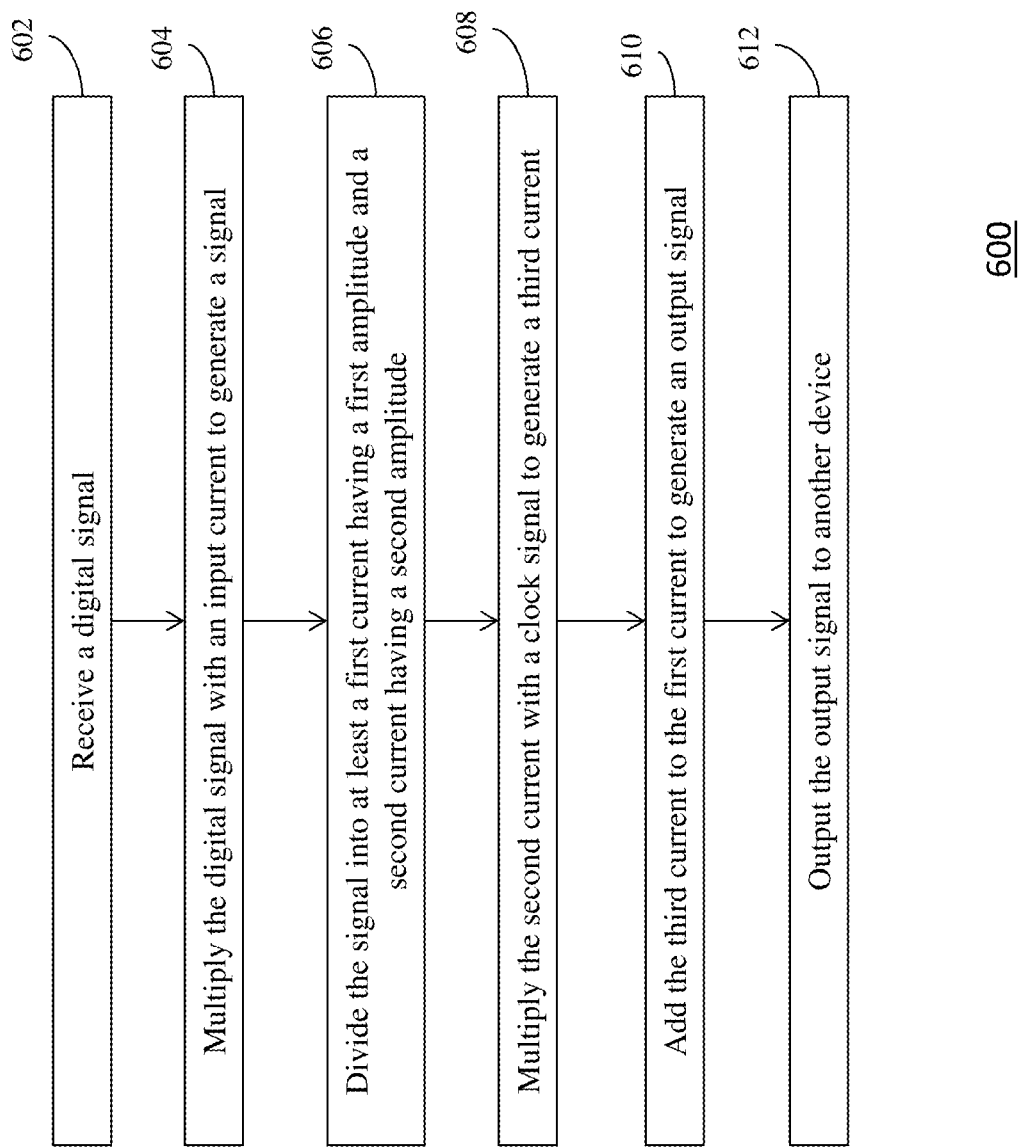
FIG. 6 a flow diagram illustrating a process that can be performed by a system including a mixed mode multiply and accumulate unit in one embodiment.

FIG. 6 a flow diagram illustrating a process that can be performed by a system including a mixed mode multiply and accumulate unit in one embodiment. An example process 600 may include one or more operations, actions, or functions as illustrated by one or more of blocks 602, 604, 606, 608, 610, and/or 612. Although illustrated as discrete blocks, various blocks can be divided into additional blocks, combined into fewer blocks, eliminated, or performed in parallel, depending on the desired implementation.

The process 600 can begin at block 602. At block 602, a device can receive a digital signal. The process 600 can continue from block 602 to block 604. At block 604, a current mode DAC the device can multiply the digital signal with an input current to generate a signal. The process 600 can continue from block 604 to block 606. At block 606, a current splitter of the device can divide the signal into at least a first current having a first amplitude and a second current having a second amplitude. The process 600 can continue from block 606 to block 608. At block 608, the device can multiply the second current with a clock signal to generate a third current. The process 600 can continue from block 608 to block 610. At block 610, the device can add the third current to the first current to generate an output signal.

The process 600 can continue from block 610 to block 612. At block 612, the device can output the output signal to another device. In some examples, the device receiving the output signal can be a magnetoresistive random-access memory (MRAM).

In some examples, the first signal can include a first in-phase (I) component and a first quadrature (Q) component. The second signal can include a second I component and a second Q component. The device can combine the second I component with the second Q component of the second signal. The device can determine a difference between the second I component and the second Q component of the second signal. The device can multiply the second signal with the clock signal by multiplying the clock signal with the combination of the second I component and the second Q component of the second signal to generate a first portion of the third current; and multiplying the clock signal with the difference between the second I component and the second Q component of the second signal to generate a second portion of the third current. The device can combine the first portion of the third current and the second portion of the third current to generate the third current.

In some examples, the device can multiply a local oscillator clock signal with the first signal to generate a first heterodyne signal. The device can multiply the local oscillator clock signal with the second signal to generate a second heterodyne signal. The device can multiply the second signal with the clock signal by multiplying the second heterodyne signal with the clock signal to generate the third signal. The device can use a transformer and a matching network to transmit the output signal to the device receiving the output signal.

Figure 7:
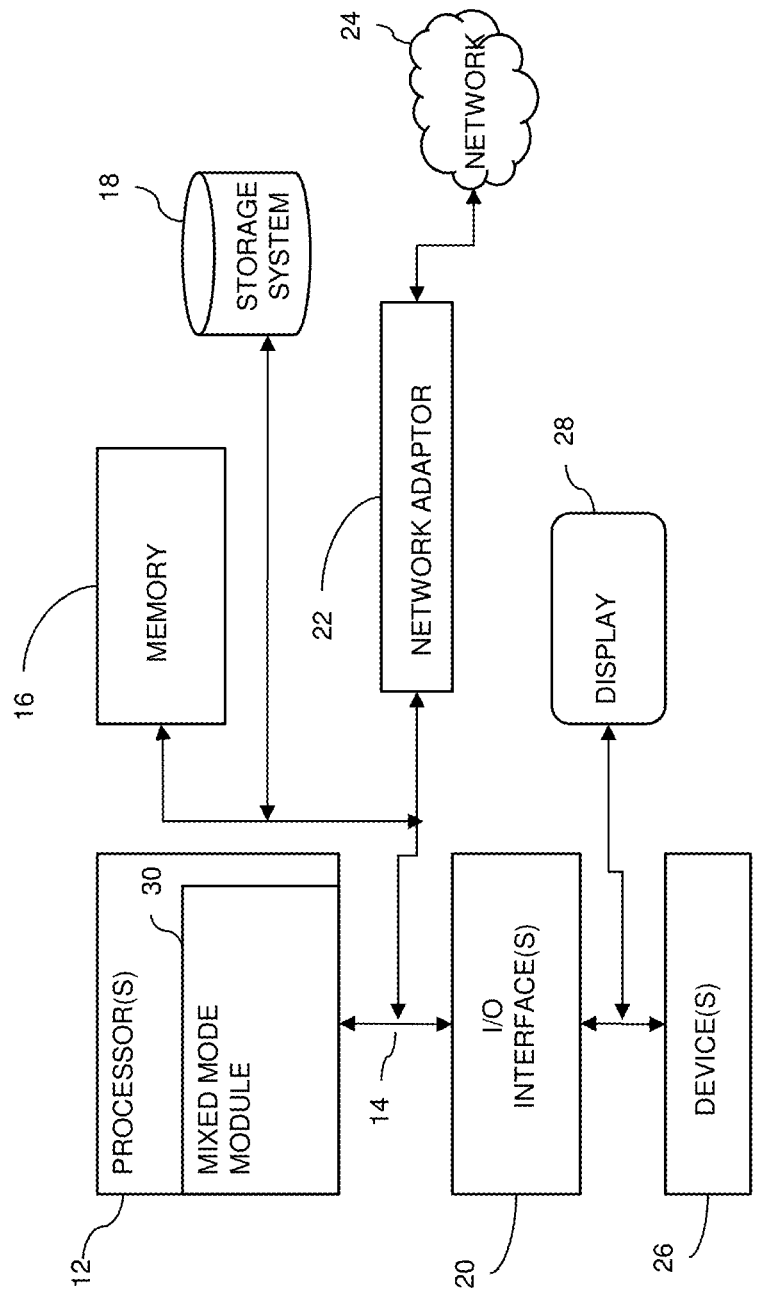
FIG. 7 illustrates a schematic of an example computer or processing system that may implement a mixed mode multiply and accumulate unit, in one embodiment of the present disclosure.

FIG. 7 illustrates a schematic of an example computer or processing system that may implement a mixed mode multiply and accumulate unit, in one embodiment of the present disclosure. The computer system is only one example of a suitable processing system and is not intended to suggest any limitation as to the scope of use or functionality of embodiments of the methodology described herein. The processing system shown can be operational with numerous other general purpose or special purpose computing system environments or configurations. Examples of well-known computing systems, environments, and/or configurations that can be suitable for use with the processing system shown in FIG. 7 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, supercomputers, and distributed cloud computing environments that include any of the above systems or devices, and the like.

The computer system can be described in the general context of computer system executable instructions, such as program modules, being executed by a computer system. Generally, program modules may include routines, programs, objects, components, logic, data structures, and so on that perform particular tasks or implement particular abstract data types. The computer system can be practiced in distributed cloud computing environments where tasks are performed by remote processing devices that are linked through a communications network. In a distributed cloud computing environment, program modules can be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 (e.g., mixed mode module 30) that performs the methods described herein. The module 30 can be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media can be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention can be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device comprising:
a first current mode digital-to-analog converter (DAC) configured to multiply an input signal with a first current having a first amplitude to generate a first signal;
a second current mode DAC configured to multiply the input signal with a second current having a second amplitude to generate a second signal, wherein the second amplitude is less than the first amplitude;
a mixer configured to multiply the second signal with a clock signal to generate a third signal;
wherein:
the third signal is combined with the first signal via a current summing node to generate an output signal; and
the output signal is outputted to another device.

2. The device of claim 1, wherein the input signal is a digital signal.

3. The device of claim 1, wherein:
the first current mode DAC is configured to sample the first signal at a sampling frequency; and
the second current mode DAC is configured to sample the second signal at the sampling frequency.

4. The device of claim 1, wherein:
the first signal includes at least one of a first in-phase (I) component and a first quadrature (Q) component; and
the second signal includes at least one of a second I component and a second Q component.

5. The device of claim 4, wherein:
the current summing node is a first current summing node;
the first I component and the first Q component of the first signal are combined via a second current summing node;
the second I component and the second Q component of the second signal are combined via a third current summing node;
a difference between the second I component and the second Q component of the second signal is outputted from a current difference node;
the mixer is configured to:
multiply the clock signal with the combination of the second I component and the second Q component of the second signal to generate a first portion of the third signal;
multiply the clock signal with the difference between the second I component and the second Q component of the second signal to generate a second portion of the third signal; and
the first portion of the third signal and the second portion of the third signal is combined via a fourth current summing node.

6. The device of claim 1, wherein the mixer is a first mixer, and the device further comprises a second mixer configured to:
multiply a local oscillator clock signal with the first signal to generate a first heterodyne signal;
multiply the local oscillator clock signal with the second signal to generate a second heterodyne signal; and
wherein the first mixer is configured to multiply the second heterodyne signal with the clock signal to generate the third signal.

7. The device of claim 6, further comprises a transformer and a matching network circuit configured to facilitate a transmission of the output signal to said another device.

8. The device of claim 1, wherein the output signal is outputted to a non-volatile memory.

9. A system comprising:
a processor configured to:
generate an input signal;
generate a clock signal;
a first device configured to be in communication with the processor, the first device comprising:
a first current mode digital-to-analog converter (DAC) configured to multiply the input signal with a first current having a first amplitude to generate a first signal;
a second current mode DAC configured to multiply the input with a second current having a second amplitude to generate a second signal, wherein the second amplitude is less than the first amplitude;
a mixer configured to multiply the second signal with the clock signal generated by the processor to generate a third signal; and
wherein:
the third signal is combined with the first signal via a current summing node to generate an output signal; and
the output signal is outputted to a second device.

10. The system of claim 9, wherein the input signal is a digital signal.

11. The system of claim 9, wherein:
the first current mode DAC is configured to sample the first signal at a sampling frequency; and
the second current mode DAC is configured to sample the second signal at the sampling frequency.

12. The system of claim 9, wherein:
the first signal includes at least one of a first in-phase (I) component and a first quadrature (Q) component; and
the second signal includes at least one of a second I component and a second Q component.

13. The system of claim 12, wherein:
the current summing node is a first current summing node;
the first I component and the first Q component of the first signal are combined via a second current summing node;
the second I component and the second Q component of the second signal are combined via a third current summing node;
a difference between the second I component and the second Q component of the second signal is outputted from a current difference node;
the mixer is configured to:
multiply the clock signal with the combination of the second I component and the second Q component of the second signal to generate a first portion of the third signal;
multiply the clock signal with the difference between the second I component and the second Q component of the second signal to generate a second portion of the third signal; and the first portion of the third signal and the second portion of the third signal are combined via a fourth current summing node.

14. The system of claim 9, wherein the mixer is a first mixer, and the first device further comprises a second mixer configured to:
   multiply a local oscillator clock signal generated by the processor with the first signal to generate a first heterodyne signal;
   multiply the local oscillator clock signal with the second signal to generate a second heterodyne signal; and
   wherein the first mixer is configured to multiply the second heterodyne signal with the clock signal to generate the third signal.

15. The system of claim 14, wherein the first device comprises a transformer and a matching network circuit configured to facilitate a transmission of the output signal to the second device.

16. The system of claim 9, wherein the second device is a non-volatile memory.

17. A method comprising:
   receiving, by a device, a digital signal;
   multiplying, by a first current mode DAC of the device, the digital signal with a first current having a first amplitude to generate a first signal;
   multiplying, by a second current mode DAC of the device, the digital signal with a second current having a second amplitude to generate a second signal, wherein the second amplitude is less than the first amplitude;
   multiplying, by the device, the second signal with a clock signal to generate a third signal; and
   adding, by the device, the third signal to the first signal to generate an output signal; and
   outputting, by the device, the output signal to another device.

18. The method of claim 17, wherein:
   the first signal includes at least one of a first in-phase (I) component and a first quadrature (Q) component; and
   the second signal includes at least one of a second I component and a second Q component;
   the method further comprises:
      combining, by the device, the first I component with the first Q component of the first signal;
      combining, by the device, the second I component with the second Q component of the second signal;
      determining, by the device, a difference between the second I component and the second Q component of the second signal;
   wherein multiplying the second signal with the clock signal comprises:
      multiplying the clock signal with the combination of the second I component and the second Q component of the second signal to generate a first portion of the third signal;
      multiplying the clock signal with the difference between the second I component and the second Q component of the second signal to generate a second portion of the third signal;
   combining, by the device, the first portion of the third signal and the second portion of the third signal.

19. The method of claim 17, further comprises:
   multiplying a local oscillator clock signal with the first signal to generate a first heterodyne signal;
   multiplying the local oscillator clock signal with the second signal to generate a second heterodyne signal; and
   wherein multiplying the second signal with the clock signal comprises multiplying the second heterodyne signal with the clock signal to generate the third signal;
   transmitting the output signal to said another device using a transformer and a matching network.

20. The method of claim 17, wherein said another device is a non-volatile memory.

* * * * *